United States Patent
Oh et al.

(10) Patent No.: US 7,902,567 B2
(45) Date of Patent: Mar. 8, 2011

(54) ORGANIC LIGHT EMITTING DISPLAY PROVIDING ULTRAVIOLET RAY PROTECTION AND METHOD OF MANUFACTURING SAME

(75) Inventors: Tae-sik Oh, Suwon-Si (KR); Young-gu Lee, Suwon-si (KR); Sung-kee Kang, Seongnam-si (KR); Ick-hwan Ko, Seoul (KR); Young-tea Chun, Suwon-si (KR); Hong-shik Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1191 days.

(21) Appl. No.: 11/493,224

(22) Filed: Jul. 26, 2006

(65) Prior Publication Data

US 2007/0182314 A1 Aug. 9, 2007

(30) Foreign Application Priority Data

Feb. 3, 2006 (KR) .................. 10-2006-0010593

(51) Int. Cl.
*H01L 33/00* (2010.01)
(52) U.S. Cl. ................... 257/100; 257/E25.008
(58) Field of Classification Search .............. 257/100, 257/E25.008
See application file for complete search history.

(56) References Cited

U.S. PATENT DOCUMENTS 7,005,199 B2 * 2/2006 Kim et al. ................ 428/690
2004/0245541 A1 * 12/2004 Shitagaki et al. ............ 257/103

FOREIGN PATENT DOCUMENTS

JP 2004-139767 5/2004
KR 1020010050684 6/2001

* cited by examiner

*Primary Examiner* — David A Zarneke
*Assistant Examiner* — Jenny L Wagner
(74) *Attorney, Agent, or Firm* — Cantor Colburn LLP

(57) ABSTRACT

An organic light emitting display including an ultraviolet protecting layer and a method of manufacturing the same include a lower substrate; an ultraviolet hardening adhesive formed on the lower substrate; a driving unit and a light emitting unit deposited on the lower substrate and surrounded by the ultraviolet hardening adhesive; an encapsulation layer covering the driving unit and light emitting unit and preventing moisture and oxygen penetration from an outside; an upper substrate arranged on the encapsulation layer facing the lower substrate and fixed by the ultraviolet hardening adhesive; and an ultraviolet ray blocking film formed in a region to block the driving unit and the light emitting unit from being irradiated by UV rays radiated to harden the ultraviolet hardening adhesive. The ultraviolet ray blocking film is disposed in the encapsulation layer or on the upper substrate to protect the driving unit and light emitting unit from ultraviolet rays.

5 Claims, 4 Drawing Sheets

ORGANIC LIGHT EMITTING DISPLAY PROVIDING ULTRAVIOLET RAY PROTECTION AND METHOD OF MANUFACTURING SAME

This application claims priority to Korean Patent Application No. 10-2006-0010593, filed on Feb. 3, 2006, and all the benefits accruing therefrom under 35 U.S.C. §119, and the contents of which in its entirety are herein incorporated by reference.

BACKGROUND OF THE INVENTION

1. Field of the Invention

The present invention relates to an organic light emitting display and method, and more particularly, to an organic light emitting display providing an ultraviolet ray protection function and method of manufacturing the same.

2. Description of the Related Art

Generally, organic light emitting displays include organic light emitting diodes ("OLEDs") deposited on thin film transistors ("TFTs") of an electric circuit so that a light emitting layer of a selected OLED emits light in response to a signal controlled by the TFT.

FIG. 1 shows the typical structure of such an organic light emitting display. As described above, a TFT 12 as a driving unit and an OLED 13 as a light emitting unit are deposited between a lower substrate 11 and an upper substrate 15.

The OLED 13 includes an anode 13a, a light emitting layer 13b and a cathode 13c, which are sequentially deposited upon one another, and is segmented into a matrix of pixels by bank portions 13d. In the case of a color device, the regions segmented by the bank portions 13d are subpixels producing red (R), green (G) and blue (B) light, respectively, and one color pixel consists of these 3 sub-pixels.

Reference numeral 12a denotes an insulating layer. Reference numeral 14 denotes an encapsulation layer that prevents the penetration of moisture and oxygen into the OLED 13 and has a structure including a plurality of organic layers 14a and inorganic layers 14b which are alternately deposited with respect to each other. In other words, an inorganic layer 14b is interposed between two organic layers 14a. The inorganic layer 14b, composed of, for example, a ceramic, primarily plays a role of preventing the penetration of oxygen and moisture, and the organic layer 14a primarily performs the function of providing flexibility.

The region where the OLEDs 13 are arranged is called a display area A1, which corresponds to an area where an image is displayed, and the outer border region in which the OLEDs 13 are not arranged is called a non-display area A2. When binding an upper substrate 15 to the device, an ultraviolet ray ("UV") sealing adhesive 16 is applied to the non-display area A2 and cured. That is, after applying the UV sealing adhesive 16 to the non-display area A2 and putting the upper substrate 15 on the encapsulation layer 14, ultraviolet rays are radiated for a predetermined time onto the UV sealing adhesive 16 for purposes of curing. The upper substrate 15 then binds to the encapsulation layer 14 while the adhesive 16 is hardened. The UV sealing adhesive 16 also functions as a sealing film.

When the OLED 13 or the TFT 12, in addition to the UV sealing adhesive 16, is exposed to UV rays in such a UV curing process, the characteristics of the semiconductor film are degraded. Conventionally, degradation of the semiconductor film is prevented by a method of using a shading mask to cover a region where ultraviolet rays are not to be radiated, that is, where the display region has been adopted. In other words, after forming a shading mask using, for example, quartz, and putting the shading mask on the upper substrate 15 to cover the display region, ultraviolet rays are radiated only onto the UV sealing adhesive 16 to harden the UV adhesive 16.

However, since the separate shading mask has to be prepared, the manufacturing process is very complicated. In addition, the ultraviolet rays can be radiated onto the OLED 13 or the TFT layer 12 when the shading mask is not quite accurately positioned on the upper substrate 15. Accordingly, the processes of both making the shading mask and positioning the shading mask on the upper substrate 15 complicate the UV curing process.

Japanese Patent Publication No. 2004-139767 discloses a structure of applying a hygroscopic agent to a wide area between two substrates, instead of using a shading mask, and thus the hygroscopic agent blocks the ultraviolet rays from traveling to a light emitting unit and a driving unit. However, such a structure is not always possible and is possible only in the case of a so-called can type substrate in which a hollow space accommodating the hygroscopic agent is prepared. Thus, the whole manufacturing process is complicated since a separate process of preparing the hydroscopic agent and an assembly process, in addition to the film formation processes, are required as when using the conventional shading mask.

BRIEF SUMMARY OF THE INVENTION

The present invention provides an improved organic light emitting display protecting a light emitting unit and a driving unit from ultraviolet rays without the use of a separate member such as a shading mask or hydroscopic agent.

According to an exemplary embodiment of the present invention, an organic light emitting display comprises: a lower substrate; an ultraviolet hardening adhesive formed on the lower substrate; a driving unit and a light emitting unit deposited on the lower substrate and surrounded by the ultraviolet hardening adhesive; an encapsulation layer covering the driving unit and light emitting unit and preventing moisture and oxygen penetration from an outside; an upper substrate arranged on the encapsulation layer in order to face the lower substrate and fixed by the ultraviolet hardening adhesive; and an ultraviolet ray blocking film formed in a region to block the driving unit and the light emitting unit from being irradiated by UV rays radiated to harden the ultraviolet hardening adhesive.

The ultraviolet ray blocking film may be formed in the encapsulation layer. The encapsulation layer may have a multi-layered structure comprising inorganic layers and organic layers and the ultraviolet ray blocking film is formed within the multi-layered structure.

Moreover, the ultraviolet ray blocking film may be coated on at least one of the outer surface and the inner surface of the upper substrate.

The upper substrate of the organic light emitting display may be made of glass, plastic or metal. The ultraviolet ray blocking film is composed of at least one ultraviolet-absorbing agent selected from the group consisting of benzotriazoles, benzophenones, salicylic acids and cyano acrylates.

According to another exemplary embodiment of the present invention, a method of manufacturing an organic light emitting display including an ultraviolet protecting layer is provided. The method includes: forming an ultraviolet hardening adhesive on a lower substrate; depositing a driving unit and a light emitting unit on the lower substrate and surrounded by the ultraviolet hardening adhesive; covering the driving unit and light emitting unit with an encapsulation layer preventing moisture and oxygen penetration from an outside; arranging an upper substrate on the encapsulation layer facing the lower substrate; forming an ultraviolet ray blocking film in a region to block the driving unit and the light emitting unit from being irradiated by UV rays; radiating the ultraviolet hardening adhesive with UV rays to harden the ultraviolet hardening adhesive and fix the upper substrate with the lower substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
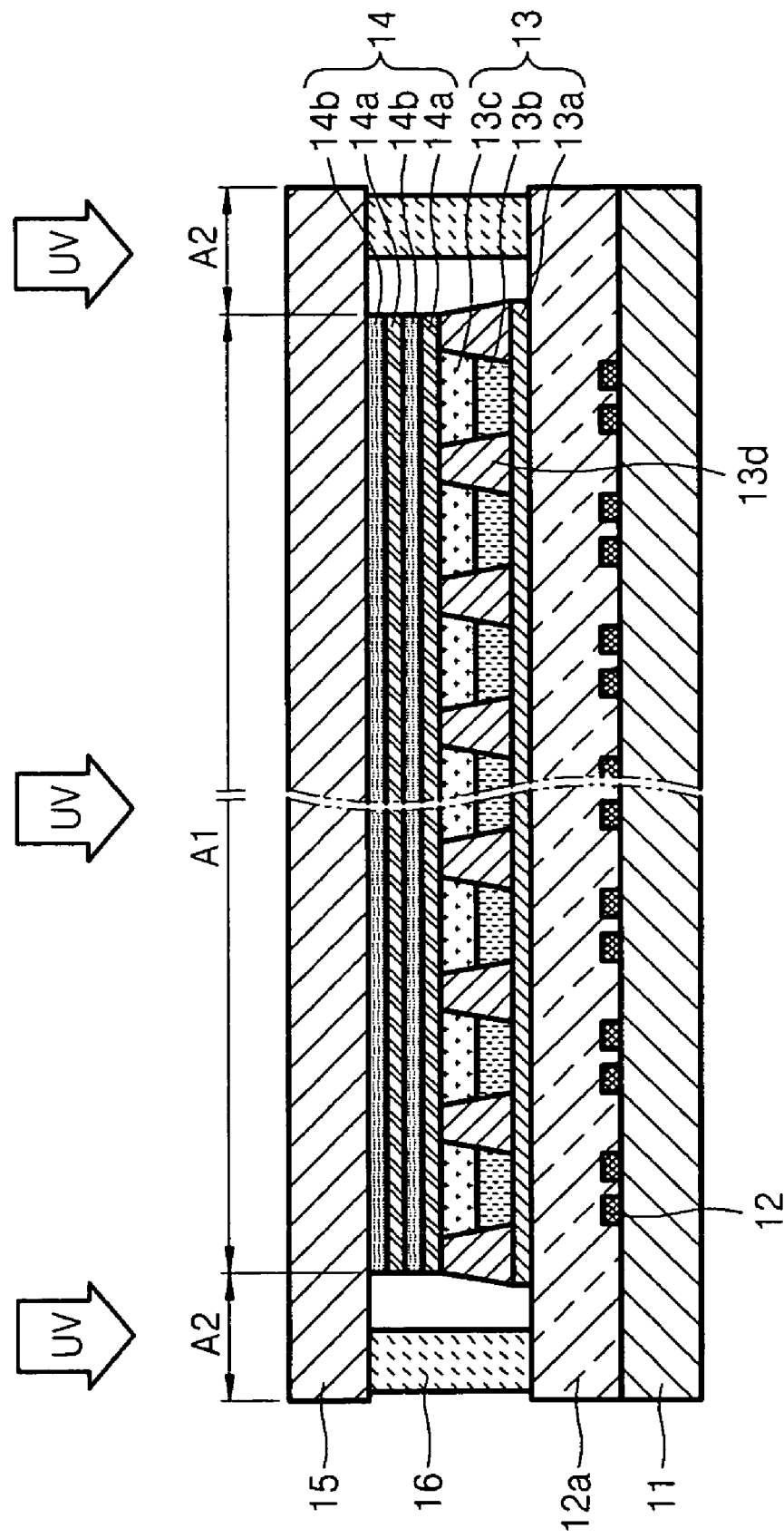
FIG. 1 is a cross-sectional view of a conventional organic light emitting display.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
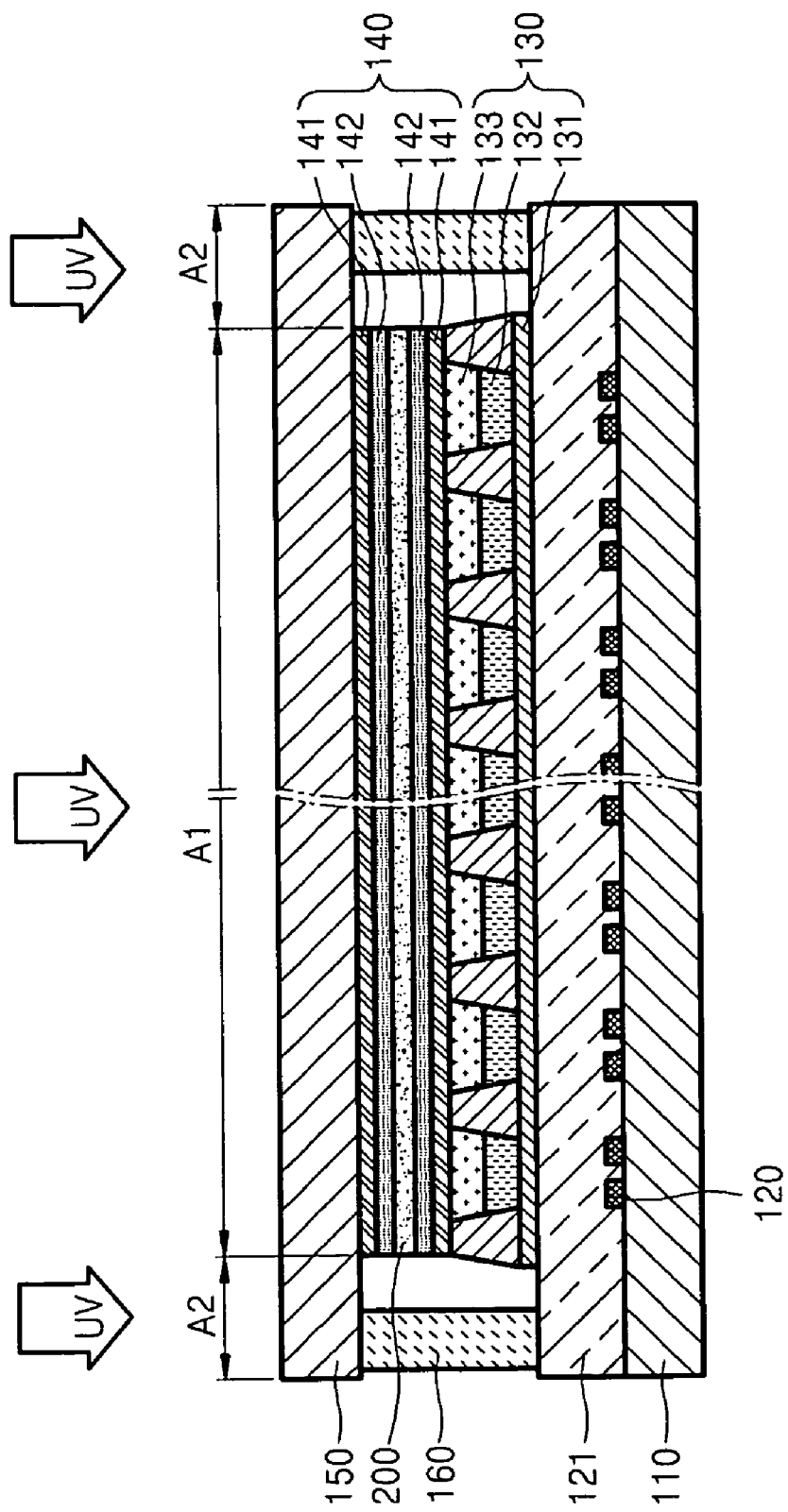
FIG. 2 is a cross-sectional view of an exemplary organic light emitting display according to an exemplary embodiment of the present invention.

FIG. 2 is a cross-sectional view of an exemplary organic light emitting display according to an exemplary embodiment of the present invention.

Referring to FIG. 2, the organic light emitting display has a laminated structure of a lower substrate 110, a TFT 120 as a driving unit, an OLED 130 as a light emitting unit, an encapsulation layer 140 that prevents the penetration of oxygen and moisture and an upper substrate 150.

This exemplary embodiment of the organic light emitting display is a top emission type display in which the light emitted from a light emitting layer 132 by a driving signal from the TFT 120 is reflected by an anode 131 composed of metal and passes through a cathode 133 composed of a transparent material like indium tin oxide (ITO) toward the upper substrate 150.

The lower substrate 110 and the upper substrate 150 may be comprised of glass, plastic, metal, etc. The upper substrate 150 is fixed to the encapsulation layer 140 by the ultraviolet hardening adhesive 160. That is, after the ultraviolet hardening adhesive 160 is applied to a non-display area A2, which forms an outer border of a display space A1, and the upper substrate 105 is put on the encapsulation layer 140, ultraviolet rays are radiated thereon. The ultraviolet hardening adhesive 160 is hardened, and the upper substrate 150 is then fixed to the encapsulation layer 140. In addition, a sealing film of the ultraviolet hardening adhesive 160 is formed. Reference numeral 121 indicates an insulating layer.

The encapsulation layer 140 has a multi-layered structure in which organic layers 141 and inorganic layers 142 are deposited together. The inorganic layer 142 can be composed of an oxide of silicon, a carbide or a nitride. For example, $SiO_2$, SiC, SiN, SiON, etc. can be used. Alternatively, $In_2O_3$, $TiO_2$, $Al_2O_3$, etc., may also be used. The organic layer 141 may be formed of a polymer organic film or a low molecular organic film. For example, polymer organic materials, such as, polyacrylate, polyurea, polyester, polyethylene, polypropylene, methacrylic, acrylic, etc., or a derivative thereof, may be used. An ultraviolet ray blocking film 200 is deposited between multi-layer structures including the organic layers 141 and inorganic layers 142. That is, the encapsulation layer 140 covers both the TFT 120 as a driving unit and the OLED 130 as a light emitting unit, and thus one or more of the ultraviolet ray blocking films 200 are included in the encapsulation layer 140 in order to protect the TFT 120 and the OLED 130 from the ultraviolet rays passing through the upper substrate 150. This laminated structure can be formed through a general deposition process such as evaporation or photolithography. The material forming the ultraviolet ray blocking film 200 may be an ultraviolet-absorbing agent selected from benzotriazoles, benzophenones, cyano acrylates and salicylic acids.

By including the ultraviolet ray blocking film 200 in the encapsulation layer 140, and then hardening the ultraviolet hardening adhesive 160 in order to later fix the upper substrate 150, there is no need to form a separate shading mask. That is, when fixing the upper substrate 150, the adhesive 160 is formed in the non-display area A2 and the upper substrate is placed on the encapsulation layer 140 as described above. Ultraviolet rays are then radiated from above the upper substrate 150 for a predetermined time to harden the adhesive 160. At this time, the ultraviolet ray blocking film 200 in the encapsulation layer 140 prevents ultraviolet rays from reaching the TFT 120 and the OLED 130. Therefore, component degradation by the ultraviolet rays is prevented. In other words, there is no need to use a separate shading mask or hygroscopic agent, and the blocking of ultraviolet rays is performed by the ultraviolet ray blocking film 200 that is formed when forming the encapsulation layer 140. Therefore, protection against ultraviolet rays is easily implemented.

Therefore, the organic light emitting display can protect the TFT 120 and light emitting unit (i.e., the OLED 130) from ultraviolet rays without using an additional process.

In the present exemplary embodiment, one ultraviolet ray blocking film 200 is formed in the multi-layered encapsulation layer 140. However, one or more ultraviolet ray blocking films can be formed if needed in the encapsulation layer 140.

Figure 3:
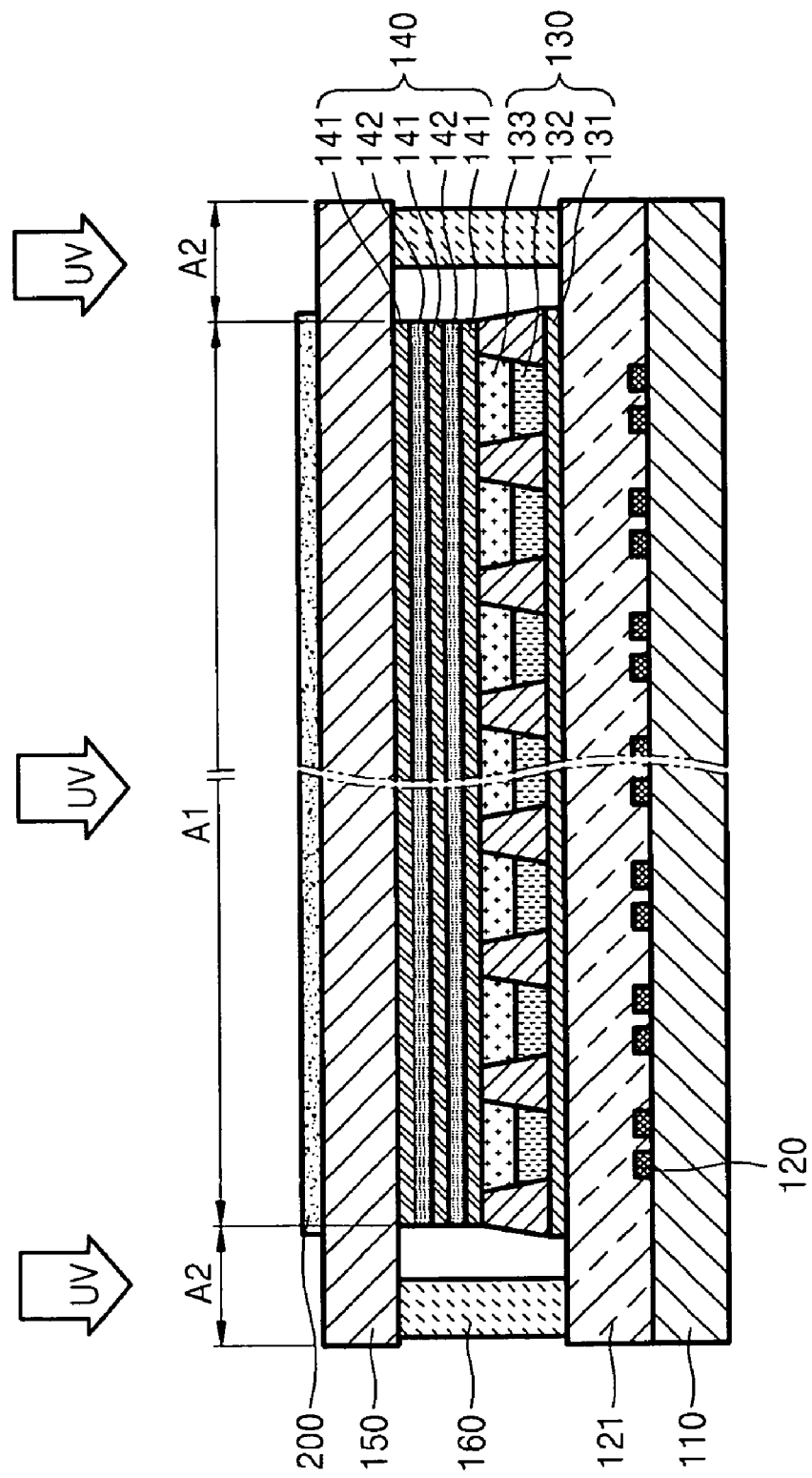
FIG. 3 is a cross-sectional view of another exemplary organic light emitting display according to another exemplary embodiment of the present invention.

Next, FIG. 3 is a cross-sectional view of another exemplary organic light emitting display according to another embodiment of the present invention. Like reference numerals in the drawings represent like elements performing like functions.

In the present exemplary embodiment, instead of forming the ultraviolet ray blocking layer 200 in the encapsulation layer 140 as in the previous exemplary embodiment described above, the ultraviolet ray blocking film 200 is coated on the outer surface of the upper substrate 150. That is, only the location of the ultraviolet ray blocking film 200 is moved to the upper substrate 150 while the ultraviolet ray blocking film 200 is located in a region to block OLED 130 as the light emitting unit and the driving unit 120 from being irradiated by UV rays radiated to harden the ultraviolet hardening adhesive 160. The ultraviolet ray blocking film 200 is coated on the outer surface of the upper substrate 150 and may be formed of an ultraviolet absorption material such as a benzotriazole, a benzophenone, a salicylic acid or a cyano acrylate. When the hardening process of the ultraviolet hardening adhesive 160 takes place, the TFT 120 and the OLED 130 can be safely protected from ultraviolet rays. The region where the ultraviolet ray blocking film 200 is coated corresponds to the display space A1 where the TFT 120 and the OLED 130 are arranged. The ultraviolet hardening adhesive 160 is disposed in the non-display area A2.

Therefore, with the ultraviolet ray blocking film 200 coated on the upper substrate 150, degradation of the TFT 120 and the OLED 130 can be prevented in the curing process of the ultraviolet hardening adhesive 160 without the need to prepare an additional member.

Figure 4:
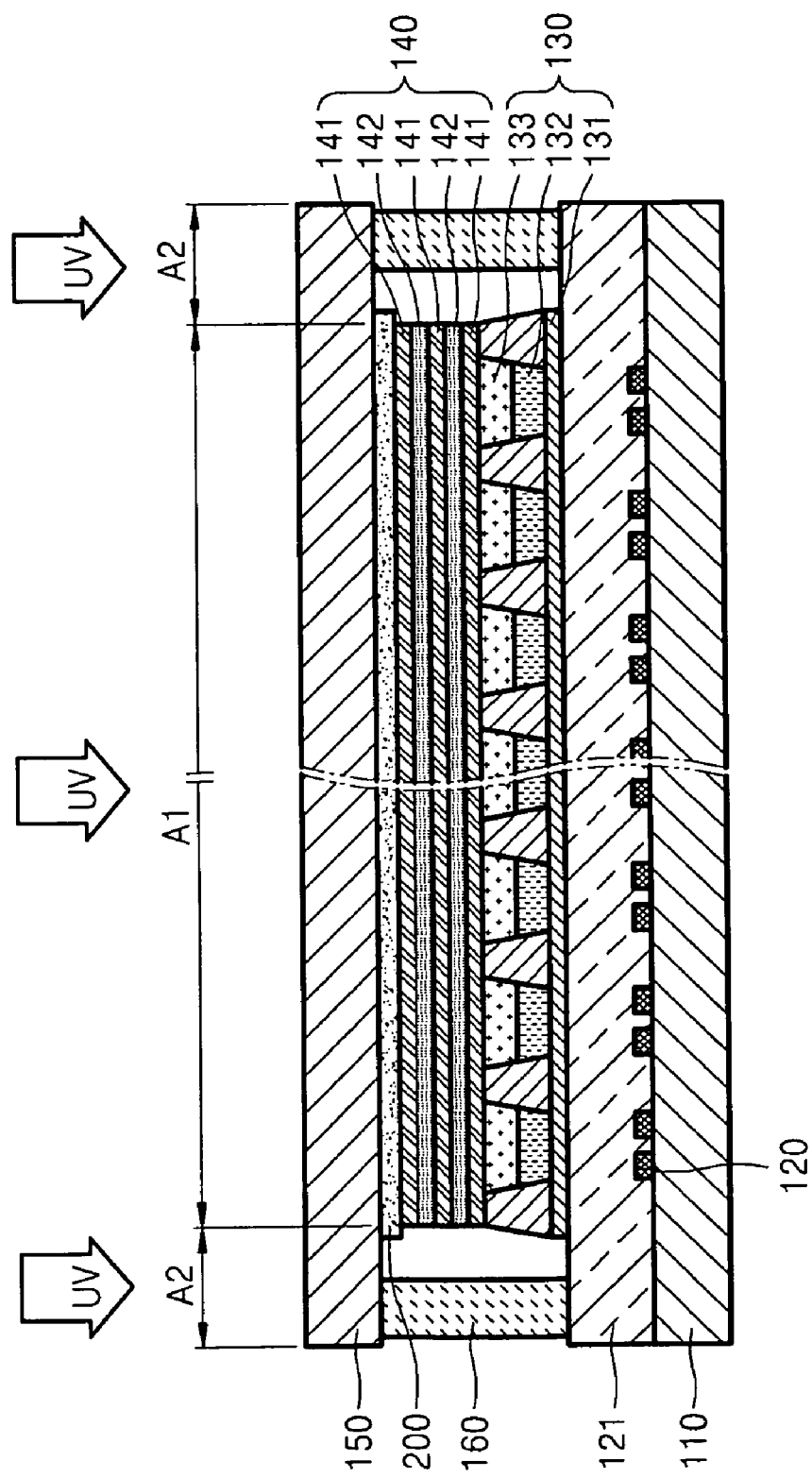
FIG. 4 is a cross-sectional view of yet another exemplary organic light emitting display according to yet another exemplary embodiment of the present invention.

FIG. 4 is a cross-sectional view of another exemplary organic light emitting display according to another embodiment of the present invention. Like reference numerals in the drawings denote like elements having like functions.

The organic light emitting display of the present exemplary embodiment has a similar structure to that of the previous exemplary embodiments of FIGS. 2 and 3. However in the present exemplary embodiment, the ultraviolet ray blocking film 200 is disposed on the inner or opposite surface of the upper substrate 150 instead of the outer face or surface of the upper substrate 150. That is, the ultraviolet ray blocking film 200 can be formed on either an inside or outside surface of the upper substrate 150. Therefore, in the ultraviolet ray radiation process for curing the ultraviolet hardening adhesive 160, the ultraviolet ray blocking film 200 can effectively prevent the degradation of the TFT 120 and the OLED 130.

If necessary, the ultraviolet ray blocking film 200 can be coated on both the outer and inner surfaces of the upper substrate 150, According to the present invention, the organic light emitting display includes the ultraviolet ray blocking film in the encapsulation layer or on the upper substrate to protect the driving unit and light emitting unit from ultraviolet rays without the use of a separate insulating member. Therefore, the degradation of the driving unit and the light emitting unit can be effectively prevented without the use of a complicated manufacturing process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display comprising:
   a lower substrate;
   an ultraviolet hardening adhesive formed on the lower substrate;
   a driving unit and a light emitting unit deposited on the lower substrate and surrounded by the ultraviolet hardening adhesive;
   an encapsulation layer covering the driving unit and light emitting unit and preventing moisture and oxygen penetration from an outside;
   an upper substrate arranged on the encapsulation layer facing the lower substrate and fixed by the ultraviolet hardening adhesive; and
   an ultraviolet ray blocking film formed in a region to block the driving unit and the light emitting unit from being irradiated by UV rays radiated to harden the ultraviolet hardening adhesive, wherein the encapsulation layer has a multi-layered structure comprising inorganic layers and organic layers; and the ultraviolet ray blocking film is disposed between the multi-layered structure of the encapsulation layer.

2. The organic light emitting display of claim 1, wherein the upper substrate is made of glass, plastic or metal.

3. The organic light emitting display of claim 1, wherein the ultraviolet ray blocking film is composed of at least one ultraviolet-absorbing agent selected from the group consisting of benzotriazoles, benzophenones, salicylic acids and cyano acrylates.

4. The organic light emitting display of claim 1, wherein the ultraviolet hardening adhesive is formed in a non-display area and the driving unit and the light emitting unit are formed in a display area.

5. The organic light emitting display of claim 4, wherein the ultraviolet ray blocking film is aligned with the display area.

* * * * *